(12) United States Patent
Matsumura et al.

(10) Patent No.: US 8,759,989 B2
(45) Date of Patent: Jun. 24, 2014

(54) PHOTOSENSITIVE ADHESIVE COMPOSITION, PHOTOSENSITIVE ADHESIVE FILM, AND SEMICONDUCTOR DEVICE USING EACH

(75) Inventors: Kazuyuki Matsumura, Otsu (JP); Kanako Sugimoto, Otsu (JP); Hiroyuki Niwa, Otsu (JP); Chikara Inagaki, Urayasu (JP)

(73) Assignee: Toray Industries, Inc., Tokyo (JP)

( * ) Notice: Subject to any disclaimer, the term of this patent is extended or adjusted under 35 U.S.C. 154(b) by 0 days.

(21) Appl. No.: 13/808,782

(22) PCT Filed: Jun. 10, 2011

(86) PCT No.: PCT/JP2011/063308
§ 371 (c)(1),
(2), (4) Date: Jan. 7, 2013

(87) PCT Pub. No.: WO2012/005079
PCT Pub. Date: Jan. 12, 2012

(65) Prior Publication Data
US 2013/0105998 A1    May 2, 2013

(30) Foreign Application Priority Data

Jul. 9, 2010   (JP) ................ 2010-156503

(51) Int. Cl.
*H01L 23/29* (2006.01)
*H01L 21/44* (2006.01)
*H01L 21/48* (2006.01)
*H01L 21/50* (2006.01)

(52) U.S. Cl.
USPC ............ 257/791; 524/114; 524/612; 438/124

(58) Field of Classification Search
USPC ......... 257/791, 731, 733, 778, 780, 782, 783, 257/786; 438/124, 126, 127, 108, 118, 612, 438/666; 524/110, 111, 114, 330, 611, 612; 430/281
See application file for complete search history.

(56) References Cited

FOREIGN PATENT DOCUMENTS

| JP | 2008-115241 A | 5/2008 |
|---|---|---|
| JP | 2008-239802 A | 10/2008 |
| JP | 2009-167381 A | 7/2009 |
| JP | 2009-227959 A | 10/2009 |
| WO | WO2004-109403 A1 | 12/2004 |
| WO | WO2007-004569 A1 | 1/2007 |
| WO | WO2008-084843 A1 | 7/2008 |
| WO | WO2008-149625 A1 | 12/2008 |
| WO | WO2010-024087 A1 | 3/2010 |

OTHER PUBLICATIONS

Secchaku Handbook, 3$^{rd}$ Edition, 1$^{st}$ Print, the Nikkan Kogyo Shinbun, Ltd., 1996, pp. 415-434.
International Search Report dated Aug. 2, 2011, application No. PCT/JP2011/063308.

*Primary Examiner* — Matthew Reames
*Assistant Examiner* — Dilinh Nguyen
(74) *Attorney, Agent, or Firm* — RatnerPrestia

(57) ABSTRACT

Provided is a photosensitive adhesive composition comprising (A) an alkali-soluble polyimide having particular structural unit(s) and having a particular structure at at least one end of the main chain, (B) a glycidylamine type epoxy compound of a particular structure, (C) a photopolymerizable compound, and (D) a photoinitiator, wherein (A) the alkali-soluble polyimide has a glass transition temperature of 160° C. or higher. The photosensitive adhesive composition has the ability to form patterns with an alkaline developer, excellent thermocompressibility at a low temperature to an irregular substrate after exposure, and a high adhesive strength even at a high temperature.

13 Claims, 1 Drawing Sheet

(a) 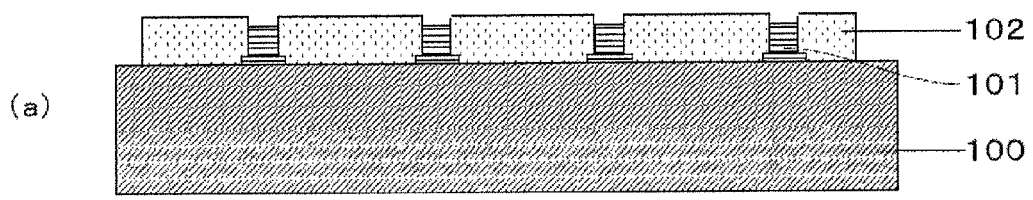
(b) 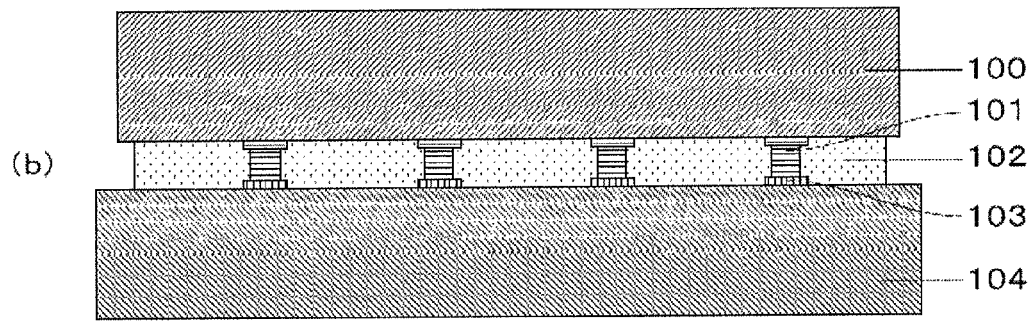

PHOTOSENSITIVE ADHESIVE COMPOSITION, PHOTOSENSITIVE ADHESIVE FILM, AND SEMICONDUCTOR DEVICE USING EACH

CROSS REFERENCE TO RELATED APPLICATIONS

This application is the U.S. National Phase application of PCT International Application No. PCT/JP2011/063308, filed Jun. 10, 2011, and claims priority to Japanese Patent Application No. 2010-156503, filed Jul. 9, 2010, the disclosures of both applications are incorporated herein by reference in their entireties for all purposes.

FIELD OF THE INVENTION

The present invention relates to a photosensitive adhesive composition, a photosensitive adhesive film, and a semiconductor device using them.

BACKGROUND OF THE INVENTION

In recent years, with increasing demand for higher-performance electronic parts, miniaturization of semiconductor devices, speeding up of working speed, and densification of wiring have been in progress, and various forms of packages corresponding to them have been proposed. In semiconductor packages, adhesives are used for the purposes of stacking chips having through silicon vias in a three-dimensional structure, bonding a chip to a supporting substrate, and forming a package having such a hollow structure as that of an image sensor and MEMS. Adhesives used for these purposes require low stress, adhesiveness, insulation reliability, and reflow soldering resistance, and further require patternability, i.e., photosensitivity in order to simplify a process or to form a package with a particular structure.

As an adhesive satisfying so many properties, a polyimide-based adhesive with excellent heat resistance and insulation properties has been studied. In particular, as an adhesive having a photosensitive function, a technique for half-curing a polyimide precursor such as polyamic acid has been proposed in Patent Document 1, for example. In Patent Documents 2 and 3, a material comprising as a base resin a closed polyimide or the like for reducing thermal damage to surrounding components has been proposed. In Patent Document 4, a photosensitive adhesive composition mainly composed of an alkali-soluble polyimide resin that shows excellent low-temperature laminate properties after pattern formation has been proposed.

PATENT DOCUMENTS

Patent Document 1: JP 2008-239802 A
Patent Document 2: WO 2004/109403
Patent Document 3: WO 2007/4569
Patent Document 4: JP 2009-167381 A

SUMMARY OF THE INVENTION

However, it was difficult to simultaneously achieve thermocompressibility after exposure and sufficient adhesiveness with the conventional polyimide-based adhesives described in Patent Documents 1 to 4. In particular, the conventional polyimide-based adhesives had problems in that they provide insufficient compression when performing compression at a low temperature to an irregular substrate such as a patterned substrate after exposure and that the adhesive strength decreases as a result of a high-temperature treatment such as reflow soldering. If the thermocompressibility to an irregular substrate at a low temperature is poor, a problem arises in that when a chip is bonded to a substrate afterwards, voids occur between the chip and the irregular substrate, which results in adhesion failure, leading to reduced reliability as a semiconductor package.

In view of these circumstances, the present invention provides a photosensitive adhesive having the ability to form patterns with an alkaline developer, excellent thermocompressibility at a low temperature to an irregular substrate after exposure, and a high adhesive strength even at a high temperature.

The problems of the prior art described above can be solved by a photosensitive adhesive composition comprising (A) an alkali-soluble polyimide having structural unit(s) represented by Formula (1) below and having a structure represented by Formula (2) and/or (3) at least one end of the main chain, (B) a glycidylamine type epoxy compound represented by Formula (4) or (5) below, (C) a photopolymerizable compound, and (D) a photoinitiator, wherein (A) the alkali-soluble polyimide has a glass transition temperature of 160° C. or higher.

[Chemical Formula 1]

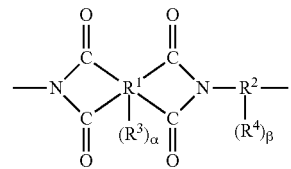
(1)

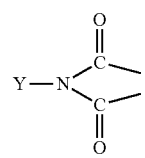
(2)

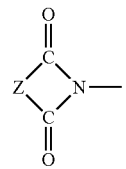
(3)

(In Formula (1) to (3) above, Y represents a monovalent organic group having at least one group selected from the group consisting of carboxyl group, phenolic hydroxyl group, sulfonic group, and thiol group, and Z represents a divalent organic group having at least one group selected from the group consisting of carboxyl group, phenolic hydroxyl group, sulfonic group, and thiol group. $R^1$ represents a tetra- to tetradeca-valent organic group; $R^2$ represents a di- to dodeca-valent organic group; and $R^3$ and $R^4$ independently represent at least one group selected from the group consisting of carboxyl group, phenolic hydroxyl group, sulfonic group, and thiol group. α and β independently represent an integer from 0 to 10.)

[Chemical Formula 2]

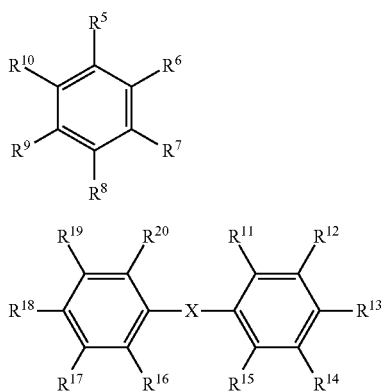

(In Formula (4) to (5) above, $R^5$ to $R^{20}$ may be the same or different from each other and are glycidyl ether group, group represented by Formula (6) below, hydrogen atom, or $C_1$-$C_5$ alkyl group, provided that, in Formula (4), at least one of $R^5$ to $R^{10}$ is glycidyl ether group and at least one is group represented by Formula (6) below, or at least two of $R^5$ to $R^{10}$ are group represented by Formula (6) below. In Formula (5), at least one of $R^{11}$ to $R^{15}$ and at least one of $R^{16}$ to $R^{20}$ are group represented by Formula (6) below. In Formula (5) above, X represents direct linkage, $C_1$-$C_6$ alkylene group, ether group, thio ether group, sulfonyl group, or arylene group. The alkylene group may be linear or cyclic.)

[Chemical Formula 3]

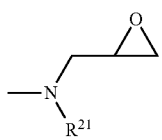

(In Formula (6) above, $R^{21}$ is glycidyl group or $C_1$-$C_5$ alkyl group.)

The present invention provides a photosensitive adhesive composition having the ability to form patterns with an alkaline developer, excellent thermocompressibility at a low temperature to an irregular substrate after exposure, and a high adhesive strength even at a high temperature.

BRIEF DESCRIPTION OF THE DRAWING

FIG. 1 illustrates an example of the method of manufacturing a semiconductor device using the photosensitive adhesive composition of the present invention.

DETAILED DESCRIPTION OF EMBODIMENTS OF THE INVENTION

The photosensitive adhesive composition of an embodiment of the present invention comprises (A) an alkali-soluble polyimide having structural unit(s) represented by Formula (1) above and having a structure represented by Formula (2) and/or (3) at at least one end of the main chain, (B) a glycidylamine type epoxy compound represented by Formula (4) or (5) above, (C) a photopolymerizable compound, and (D) a photoinitiator.

Examples of the form of the photosensitive adhesive composition in the present invention before curing include, but are not limited to, a varnish, a film, a sheet applied on a supporting substrate, and the like. Further, unlike an adhesive composition containing a polyimide precursor, this photosensitive adhesive composition does not require conversion of a polyimide precursor into a polyimide by a ring closure reaction using heating or an appropriate catalyst because of containing an already closed polyimide. Therefore, this photosensitive adhesive composition can prevent voids that occur between a substrate and an adhesive when the substrate is adhered. Further, this photosensitive adhesive eliminates the need of a heat treatment at a high temperature before thermocompression to a substrate, which treatment was requisite in the technique of Patent Document 1 above, and, consequently, a curing reaction between the epoxy compound and an alkali-soluble group in the polyimide is inhibited, thereby allowing thermocompression to an irregular substrate at a low temperature. Furthermore, because the stress due to cure shrinkage upon imide ring closure reaction is small, the photosensitive adhesive composition is able to form a thick film more easily than the resin composition containing a polyimide precursor.

(A) the alkali-soluble polyimide in the present invention desirably has an alkali-soluble functional group in order to carry out development by an aqueous alkaline solution. The alkali-soluble functional group is a functional group having acidic properties, and specific examples include phenolic hydroxyl group, carboxyl group, sulfonic group, and the like. Alkali-soluble herein refers to being soluble in 100 g of 2.38% aqueous solution of tetramethylammonium hydroxide by 0.1 g or more at 25° C. Among the alkali-soluble groups described above, phenolic hydroxyl group is preferred in view of problems such as a pot life of the photosensitive adhesive composition and corrosion of copper wiring which is a conductor. The alkali-soluble group can be introduced into a polyimide by providing diamine, tetracarboxylic dianhydride, or an end capping agent with an alkali-soluble group. It should be noted that although carboxyl groups derived from tetracarboxylic dianhydride remain when the imidization rate of the polyimide is less than 100%, the carboxyl groups are not included in the alkali-soluble group here.

(A) the alkali-soluble polyimide in the present invention preferably has structural unit(s) of Formula (1) below and has a structure of Formula (2) and/or (3) at at least one end of the main chain.

[Chemical Formula 4]

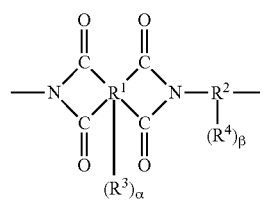

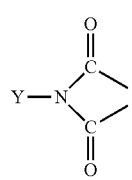

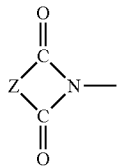
(3)

In Formulas, Y represents a monovalent organic group having at least one group selected from the group consisting of carboxyl group, phenolic hydroxyl group, sulfonic group, and thiol group, and Z represents a divalent organic group having at least one group selected from the group consisting of carboxyl group, phenolic hydroxyl group, sulfonic group, and thiol group. Y is preferably aromatic group, and Z is preferably aromatic group or group having a carbon-carbon double bond. In particular, Y and Z preferably have phenolic hydroxyl group or thiol group.

$R^1$ represents a tetra- to tetradeca-valent organic group; $R^2$ represents a di- to dodeca-valent organic group; and $R^3$ and $R^4$ independently represent at least one group selected from the group consisting of carboxyl group, phenolic hydroxyl group, sulfonic group, and thiol group. α and β independently represent an integer from 0 to 10.

In the present invention, (A) the alkali-soluble polyimide preferably has a weight average molecular weight of 10,000 to 100,000. When two or more soluble polyimides are contained, only at least one of them needs to have a weight average molecular weight in the range described above. When the weight average molecular weight is not less than 10,000, a cured film has an improved mechanical property and an enhanced adhesive strength. On the other hand, when the weight average molecular weight is not more than 100,000, occurrence of residues after development using an aqueous alkaline solution is reduced. Further, in terms of improved developability, preferably, the weight average molecular weight is preferably not more than 50,000. The weight average molecular weight in the present invention is measured by gel permeation chromatography (GPC) and calculated in terms of polystyrene.

(A) the alkali-soluble polyimide of the present invention preferably has a glass transition temperature (Tg) of 160° C. or higher. The Tg is more preferably 180° C. or higher and still more preferably 200° C. or higher. When the Tg is in this range, the adhesive strength at a high temperature will be enhanced. The Tg in the present invention is measured by differential scanning calorimetry (DSC), and in a curve obtained by differentiating a measured DSC curve of polyimide powder, the temperature at the maximum value is the Tg.

(A) the alkali-soluble polyimide is obtained by the reaction between tetracarboxylic dianhydride and diamine.

In Formula (1), $R^1$ is a residue of tetracarboxylic dianhydride. $R^1$ is preferably organic group with 8 to 40 carbon atoms containing aromatic group or cyclic aliphatic group.

Specific examples of tetracarboxylic dianhydrides include aromatic tetracarboxylic dianhydrides such as pyromellitic dianhydride, 3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenone tetracarboxylic dianhydride, 2,2',3,3'-benzophenone tetracarboxylic dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4-dicarboxyphenyl)sulfone dianhydride, bis(3,4-dicarboxyphenyl)ether dianhydride, 1,2,5,6-naphthalene tetracarboxylic dianhydride, 9,9-bis(3,4-dicarboxyphenyl)fluorene dianhydride, 9,9-bis{4-(3,4-dicarboxyphenoxy)phenyl}fluorene dianhydride, 2,3,6,7-naphthalene tetracarboxylic dianhydride, 2,3,5,6-pyridine tetracarboxylic dianhydride, 3,4,9,10-perylene tetracarboxylic dianhydride, and 2,2-bis(3,4-dicarboxyphenyl)hexafluoropropane dianhydride; aliphatic tetracarboxylic dianhydrides such as butanetetracarboxylic dianhydride and 1,2,3,4-cyclo pentanetetracarboxylic dianhydride; acid dianhydrides having structures shown below; and the like. These are used alone or in combination of two or more.

[Chemical Formula 5]

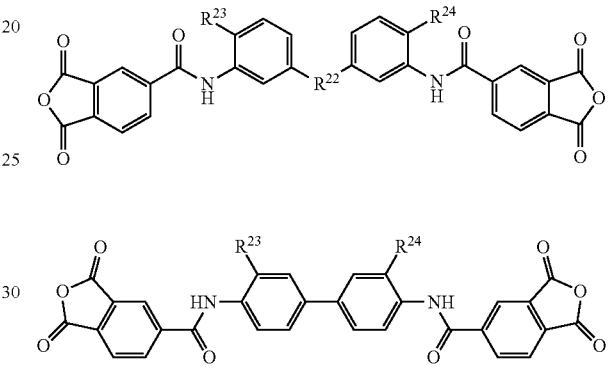

Here, $R^{22}$ represents a group selected from an oxygen atom, $C(CF_3)_2$, $C(CH_3)_2$, CO, COO, and $SO_2$, and $R^{23}$ and $R^{24}$ each represent a group selected from a hydrogen atom, a hydroxyl group, and a thiol group.

In Formula (1), $R^2$ is a residue of diamine. $R^2$ is preferably organic group with 5 to 40 carbon atoms containing aromatic group or cyclic aliphatic group. Specific examples of diamines include 3,3'-diaminodiphenyl ether, 3,4'-diaminodiphenyl ether, 4,4'-diaminodiphenyl ether, 3,3'-diaminodiphenylmethane, 3,4'-diaminodiphenylmethane, 4,4'-diaminodiphenylmethane, 3,3'-diaminodiphenylsulfone, 3,4'-diaminodiphenylsulfone, 4,4'-diaminodiphenylsulfone, 3,4'-diaminodiphenylsulfide, 4,4'-diaminodiphenylsulfide, 1,4-bis(4-aminophenoxy)benzene, 1,3-bis(4-aminophenoxy)benzene, 1,3-bis(3-aminophenoxy)benzene, benzidine, m-phenylenediamine, p-phenylenediamine, 1,5-naphthalenediamine, 2,6-naphthalenediamine, bis(4-aminophenoxyphenyl)sulfone, bis(3-aminophenoxyphenyl)sulfone, bis(4-aminophenoxy)biphenyl, bis{4-(4-aminophenoxy)phenyl}ether, 1,4-bis(4-aminophenoxy)benzene, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, 2,2'-di(trifluoromethyl)-4,4'-diaminobiphenyl, 9,9-bis(4-aminophenyl)fluorene, or compounds in which the aromatic ring of these diamines is substituted with an alkyl group or a halogen atom; aliphatic cyclohexyl diamine and methylenebiscyclohexylamine; diamines having structures shown below; and the like. These are used alone or in combination of two or more.

[Chemical Formula 6]

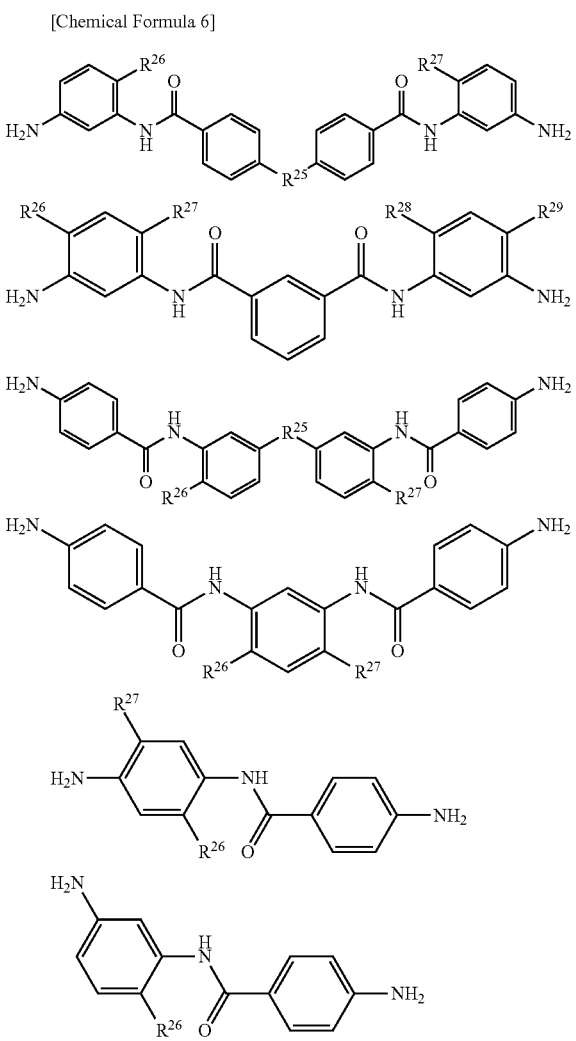

Here, $R^{25}$ represents a group selected from oxygen atom, $C(CF_3)_2$, $C(CH_3)_2$, CO, COO, and $SO_2$, and $R^{26}$ to $R^{29}$ each represents group selected from hydroxyl group and thiol group.

Among them, 3,3'-diaminodiphenyl ether, 3,4'-diaminodiphenyl ether, 4,4'-diaminodiphenyl ether, 3,3'-diaminodiphenylmethane, 3,4'-diaminodiphenylmethane, 4,4'-diaminodiphenylmethane, 3,3'-diaminodiphenylsulfone, 3,4'-diaminodiphenylsulfone, 4,4'-diaminodiphenylsulfone, 3,4'-diaminodiphenylsulfide, 4,4'-diaminodiphenylsulfide, m-phenylenediamine, p-phenylenediamine, 1,4-bis(4-aminophenoxy)benzene, 9,9-bis(4-aminophenyl)fluorene, diamines having structures shown below, and the like are preferred.

[Chemical Formula 7]

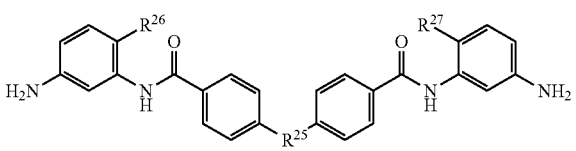

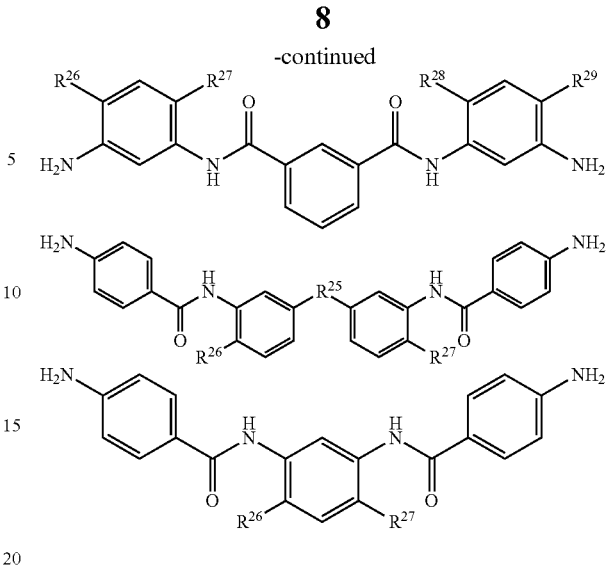

Here, $R^{25}$ represents a group selected from oxygen atom, $C(CF_3)_2$, $C(CH_3)_2$, and $SO_2$, and $R^{26}$ to $R^{29}$ each represents group selected from hydroxyl group and thiol group.

Further, to enhance the adhesiveness to a substrate, a diamine having siloxane structure may be copolymerized to the extent that the heat resistance is not reduced. Specific examples include copolymers with 1 to 10 mol % of bis(3-aminopropyl)tetramethyldisiloxane, bis(p-amino-phenyl)octamethylpentasiloxane, and the like.

In (A) the alkali-soluble polyimide used in the present invention, at least a part of the ends of the main chain is preferably capped with primary monoamine or dicarboxylic anhydride. The weight average molecular weight of the alkali-soluble polyimide can be controlled in an appropriate range by using such an end capping agent. Further, the end capping agent has alkali-soluble group in terms of improving alkali-solubility.

In Formula (2), Y is derived from an end capping agent primary monoamine. Specific preferred examples of the end capping agent include primary monoamines such as 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-aminothiophenol, 3-aminothiophenol, and 4-aminothiophenol.

In Formula (3), Z is derived from end capping agent dicarboxylic anhydride. Preferred examples of dicarboxylic anhydrides include 4-carboxyphthalic anhydride, 3-hydroxyphthalic anhydride, cis-aconitic anhydride, and the like. These are used alone or in combination of two or more.

(A) the alkali-soluble polyimide used in the present invention can be synthesized using a known method by replacing some diamine with end capping agent primary monoamine or by replacing tetracarboxylic dianhydride with end capping agent dicarboxylic anhydride. For example, a polyimide precursor is obtained using methods such as a method in which tetracarboxylic dianhydride, diamine compound, and monoamine are reacted at a low temperature, a method in which tetracarboxylic dianhydride, dicarboxylic anhydride, and diamine compound are reacted at a low temperature, and a method in which a diester is obtained from tetracarboxylic dianhydride and alcohol and then reacted in the presence of diamine, monoamine, and a condensing agent. Thereafter, a polyimide can be synthesized by using a known imidization reaction method.

When a polyimide having structural unit(s) represented by Formula (1) is used as (A) the alkali-soluble polyimide used in the present invention, the polyimide may be one composed of only the structural unit(s) represented by Formula (1) or may be a copolymer with other structural units. In that case, it is preferable to contain the structural unit(s) represented by Formula (1) in an amount of 50 mol % or more of the total polyimides. The type and amount of the structural unit used for copolymerization or mixing are preferably selected to the extent that the heat resistance of a polyimide obtained by final heat treatment is not impaired.

The imidization rate of (A) the alkali-soluble polyimide can be readily determined, for example, by the following method. The imidization rate herein means mol % of polyimide precursors that has converted into a polyimide in synthesizing a polyimide via a polyimide precursor as described above. First, an infrared spectrum of a polymer is measured to confirm the presence of absorption peaks (near 1,780 cm$^{-1}$, near 1,377 cm$^{-1}$) of an imide structure derived from a polyimide. Next, the polymer is heat treated at 350° C. for 1 hour, and then an infrared spectrum is measured again to compare peak intensities near 1,377 cm$^{-1}$ before heat treatment and after heat treatment. The imidization rate of the polymer before heat treatment is determined taking the imidization rate of the polymer after heat treatment as 100%. The imidization rate of the polymer is preferably 90% or higher.

The end capping agent introduced into the alkali-soluble polyimide, (A) component, can be detected by the following method. For example, a polyimide into which end capping agent is introduced is dissolved in an acidic solution and decomposed into amine components and carboxylic anhydride components, constituent units of the polyimide, which are measured by gas chromatography (GC) or NMR. Alternatively, the end capping agent can also be detected by directly measuring a polyimide into which an end capping agent is introduced using pyrolysis gas chromatograph (PGC) or infrared spectrum and $^{13}$C NMR spectrum.

The photosensitive adhesive composition of the present invention preferably contains (B) the glycidylamine type epoxy compound represented by either of Formula (4) or (5) below.

[Chemical Formula 8]

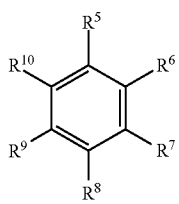

(4)

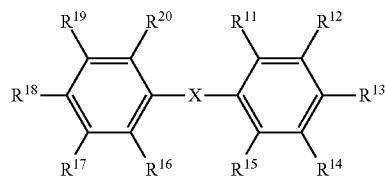

In Formulas (4) to (5) above, $R^5$ to $R^{20}$ may be the same or different from each other and are glycidyl ether group, group represented by Formula (6) below, hydrogen atom, or $C_1$-$C_5$ alkyl group, provided that, in Formula (4), at least one of $R^5$ to $R^{10}$ is glycidyl ether group and at least one is group represented by Formula (6) below, or at least two of $R^5$ to $R^{10}$ are group represented by Formula (6) below. In Formula (5), at least one of $R^{11}$ to $R^{15}$ and at least one of $R^{16}$ to $R^{20}$ are group represented by Formula (6) below. In Formula (5) above, X represents direct linkage, $C_1$-$C_6$ alkylene group, ether group, thio ether group, sulfonyl group, or arylene group. The alkylene group may be linear or cyclic.

[Chemical Formula 9]

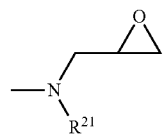

(6)

In Formula (6) above, $R^{21}$ is glycidyl group or $C_1$-$C_5$ alkyl group.

(B) the glycidylamine type epoxy compound has good compatibility with (A) the alkali-soluble polyimide, and thus crack generation in a film can be reduced when the photosensitive adhesive composition of the present invention is formed into a dry film. In addition, developability with an aqueous alkaline solution improves. Further, by having two or more epoxy groups, crosslinking reaction with the polyimide occurs during curing. This improves the heat resistance of a cured film, whereby a sufficient adhesive strength can be expressed even at a high temperature. Furthermore, by containing (B) the glycidylamine type epoxy compound described above, a photosensitive adhesive composition coated layer after exposure will have good thermocompressibility to an irregular substrate at a low temperature. In general, the thermocompressibility tends to be impaired when (A) the alkali-soluble polyimide has a high Tg, but in the present invention, the thermocompressibility is good due to the presence of the (B) component. Thus, the thermocompressibility after exposure and the adhesiveness at a high temperature can be simultaneously achieved.

In (B) the glycidylamine type epoxy compound, $R^{21}$ in Formula (6) above is preferably glycidyl group in terms of enhancing the adhesive strength at a high temperature.

Examples of (B) the glycidylamine type epoxy compound include, for example, N,N-bis(2,3-epoxypropyl)-4-(2,3-epoxypropoxy)aniline, N,N,N',N'-tetrakis(2,3-epoxypropyl)-1,4-phenylenediamine, N,N,N',N'-tetrakis(oxiran-2-ylmethyl)-4,4'-methylenedianiline, jER-630, jER-630LSD, jER-604 (trade name, available from Mitsubishi Chemical Corporation), ADEKA RESIN EP-3900S (available from ADEKA Corporation, "ADEKA RESIN EP": registered trademark), YH-434, YH-434L (trade name, available from Nippon Steel Chemical Co., Ltd.), and the like. These are used alone or in combination of two or more.

The content of (B) the glycidylamine type epoxy compound is preferably not less than 10 parts by weight in terms of expressing sufficient adhesive strength at room temperature and more preferably not less than 25 parts by weight in terms of preventing cracks when formed into a dry film, the parts being based on 100 parts by weight of (A) the alkali-soluble polyimide. Further, it is preferably not more than 150 parts by weight in terms of reducing tackiness of the dry film and more preferably not more than 120 parts by weight in terms of enhancing the adhesive strength at a high temperature.

The photosensitive adhesive composition of the present invention preferably contains (C) the photopolymerizable compound. The photopolymerizable compound is a compound having polymerizable group. Examples of polymerizable groups include, for example, unsaturated double bond functional groups such as vinyl group, allyl group, acryloyl group, and methacryloyl group and/or unsaturated triple bond functional groups such as propargyl group, among which conjugated vinyl group, acryloyl group, and methacryloyl group are preferred from the standpoint of polymerizability. Since many cross-linking points due to polymerization reaction can cause cracks in a pattern, the number of polymerizable groups is preferably 1 to 6. The polymerizable groups need not be all the same group, and the groups described above can be used in combination.

Examples of (C) the photopolymerizable compound include, for example, diethylene glycol diacrylate, triethylene glycol diacrylate, tetraethylene glycol diacrylate, diethylene glycol dimethacrylate, triethylene glycol dimethacrylate, tetraethylene glycol dimethacrylate, trimethylolpropane diacrylate, trimethylolpropane triacrylate, trimethylolpropane dimethacrylate, trimethylolpropane trimethacrylate, styrene, α-methylstyrene, 1,2-dihydronaphthalene, 1,3-diisopropenylbenzene, 3-methylstyrene, 4-methylstyrene, 2-vinylnaphthalene, butyl acrylate, butyl methacrylate, isobutyl acrylate, hexyl acrylate, isooctyl acrylate, isobornyl acrylate, isobornyl methacrylate, cyclohexyl methacrylate, 1,3-butanediol diacrylate, 1,3-butanediol dimethacrylate, neopentyl glycol diacrylate, 1,4-butanediol diacrylate, 1,4-butanediol dimethacrylate, 1,6-hexanediol diacrylate, 1,6-hexanediol dimethacrylate, 1,9-nonanediol dimethacrylate, 1,10-decanediol dimethacrylate, dimethylol-tricyclodecane diacrylate, pentaerythritol triacrylate, pentaerythritol tetraacrylate, pentaerythritol trimethacrylate, pentaerythritol tetramethacrylate, dipentaerythritol hexaacrylate, dipentaerythritol hexamethacrylate, 2-hydroxyethyl acrylate, 2-hydroxyethyl methacrylate, 1,3-diacryloyloxy-2-hydroxypropane, 1,3-dimethacryloyloxy-2-hydroxypropane, methylenebisacrylamide, N,N-dimethylacrylamide, N-methylolacrylamide, 2,2,6,6-tetramethylpiperidinyl methacrylate, 2,2,6,6-tetramethylpiperidinyl acrylate, N-methyl-2,2,6,6-tetramethylpiperidinyl methacrylate, N-methyl-2,2,6,6-tetramethylpiperidinyl acrylate, ethylene oxide-modified bisphenol A diacrylate, ethylene oxide-modified bisphenol A dimethacrylate, propylene oxide-modified bisphenol A diacrylate, propylene oxide-modified bisphenol A methacrylate, propoxylated-ethoxylated bisphenol A diacrylate, propoxylated-ethoxylated bisphenol A dimethacrylate, N-vinylpyrrolidone, N-vinylcaprolactam, and the like. These are used alone or in combination of two or more.

Among them, particularly preferred are 1,9-nonanediol dimethacrylate, 1,10-decanediol dimethacrylate, dimethyloltricyclodecane diacrylate, isobornyl acrylate, isobornyl methacrylate, pentaerythritol triacrylate, pentaerythritol tetraacrylate, pentaerythritol trimethacrylate, pentaerythritol tetramethacrylate, dipentaerythritol hexaacrylate, dipentaerythritol hexamethacrylate, methylenebisacrylamide, N,N-dimethylacrylamide, N-methylolacrylamide, 2,2,6,6-tetramethylpiperidinyl methacrylate, 2,2,6,6-tetramethylpiperidinyl acrylate, N-methyl-2,2,6,6-tetramethylpiperidinyl methacrylate, N-methyl-2,2,6,6-tetramethylpiperidinyl acrylate, ethylene oxide-modified bisphenol A diacrylate, ethylene oxide-modified bisphenol A dimethacrylate, propylene oxide-modified bisphenol A diacrylate, propylene oxide-modified bisphenol A methacrylate, propoxylated-ethoxylated bisphenol A diacrylate, propoxylated-ethoxylated bisphenol A dimethacrylate, N-vinylpyrrolidone, N-vinylcaprolactam, and the like.

The content of (C) the photopolymerizable compound is preferably not less than 40 parts by weight and more preferably not less than 50 parts by weight based on 100 parts by weight of (A) the alkali-soluble polyimide in terms of yielding a sufficient residual film after development. On the other hand, it is preferably not more than 150 parts by weight and more preferably not more than 100 parts by weight in terms of improving heat resistance of a cured film.

The photosensitive adhesive composition of the present invention preferably contains (D) the photoinitiator. Examples of (D) the photoinitiator include, for example, benzophenones such as benzophenone, Michler's ketone, 4,4-bis (diethylamino)benzophenone, and 3,3,4,4-tetra(t-butylperoxycarbonyl)benzophenone; benzylidenes such as 3,5-bis (diethylaminobenzylidene)-N-methyl-4-piperidone and 3,5-bis(diethylaminobenzylidene)-N-ethyl-4-piperidone; coumarins such as 7-diethylamino-3-nonylcoumarin, 4,6-dimethyl-3-ethylaminocoumarin, 3,3-carbonylbis(7-diethylaminocoumarin), 7-diethylamino-3-(1-methylmethylbenzoimidazolyl)coumarin, and 3-(2-benzothiazolyl)-7-diethylaminocoumarin; anthraquinones such as 2-t-butylanthraquinone, 2-ethylanthraquinone, and 1,2-benzanthraquinone; benzoins such as benzoin methyl ether, benzoin ethyl ether, and benzoin isopropyl ether; thioxanthones such as 2,4-dimethylthioxanthone, 2,4-diethylthioxanthone, 2,4-diisopropylthioxanthone, and 2-isopropylthioxanthone; mercaptos such as ethylene glycol di(3-mercaptopropionate), 2-mercaptobenzthiazole, 2-mercaptobenzoxazole, and 2-mercaptobenzimidazole; glycines such as N-phenylglycine, N-methyl-N-phenylglycine, N-ethyl-N-(p-chlorophenyl)glycine, and N-(4-cyanophenyl) glycine; oximes such as 1-phenyl-1,2-butanedione-2-(o-methoxycarbonyl)oxime, 1-phenyl-1,2-propanedione-2-(o-methoxycarbonyl)oxime, 1-phenyl-1,2-propanedione-2-(o-ethoxycarbonyl)oxime, 1-phenyl-1,2-propanedione-2-(o-benzoyl)oxime, bis(α-isonitrosopropiophenone oxime) isophthal, and 1,2-octanedione-1-[4-(phenylthio)phenyl]-2-(o-benzoyloxime); α-aminoalkylphenones such as 2-benzyl-2-dimethylamino-1-(4-morpholinophenyl)-butan-1-one and 2-methyl-1[4-(methylthio)phenyl]-2-morpholinopropan-1-one; 2,2'-bis(o-chlorophenyl)-4,4',5,5'-tetraphenylbiimidazole; and the like. Among them, combinations of compounds selected from the benzophenones, glycines, mercaptos, oximes, α-aminoalkylphenones, and 2,2'-bis(o-chlorophenyl)-4,4',5,5'-tetraphenylbiimidazole described above are suitable in terms of photoreaction. These photoinitiators are used alone or in combination of two or more. The oximes are more preferred, and particularly preferred is a compound selected from 1-phenyl-1,2-propanedione-2-(o-ethoxycarbonyl)oxime, 1-phenyl-1,2-propanedione-2-(o-benzoyl)oxime, bis(α-isonitrosopropiophenone oxime)isophthal, OXE01, OXE02 (trade name, available from Ciba Specialty Chemicals K. K.), and N-1919 and NCI-831 (trade name, available from ADEKA Corporation).

The content of (D) the photoinitiator is preferably 0.1 to 40 parts by weight based on 100 parts by weight of (A) the alkali-soluble polyimide. When two or more photoinitiators are used in combination, the total amount thereof is preferably in this range. When the content of (D) the photoinitiator is not less than 0.1 parts by weight, polymerization reaction of the polymerizable compound upon exposure proceeds well. When the content is not more than 40 parts by weight, even a thick film can maintain a sufficient light transmittance, and a pattern can be formed. The most preferred range of the content is appropriately selected within the range described above depending on the type of the photoinitiator selected.

It is preferred that the photosensitive adhesive composition of the present invention further contain (E) a liquid epoxy compound that has aromatic group and does not have any glycidyl amino group. Since (E) has aromatic group, aromatic rings interact with each other in the photosensitive adhesive composition, thereby increasing the adhesive strength at a high temperature. Further, (E) is liquid at room temperature, and thus developability with an aqueous alkaline solution will not be impaired. Furthermore, by controlling the solubility of (E) in an aqueous alkaline solution, patternability of the photosensitive adhesive composition, such as residual film thickness and pattern shapes, can be controlled. The liquid epoxy compound in the present invention refers to an epoxy compound that is liquid at room temperature.

Examples of (E) the liquid epoxy compound that has aromatic group and does not have any glycidyl amino group include bisphenol A type glycidyl ether epoxy resin, bisphenol F type glycidyl ether epoxy resin, and the like. Specific examples of (E) components include 850-S, 830-S (trade name, available from DIC Corporation), EP-4000S, EP-4000L, EP-4003S, EP-4010S (trade name, available from ADEKA Corporation), jER-828US, jER-YL983U (trade name, available from Mitsubishi Chemical Corporation), and the like.

The photosensitive adhesive composition of the present invention may contain surfactants, as required, in order to improve adhesive properties of the photosensitive adhesive composition to a substrate.

The photosensitive adhesive composition of the present invention can contain inorganic particles. By containing inorganic particles, a pattern of forward tapered shape or rectangle shape can be formed; the effect of reducing tackiness is exerted when formed into a photosensitive adhesive film; and further the effect of improving the properties of a cured film is exerted, such as chemical resistance, heat resistance, and moisture resistance.

The inorganic particles used in the present invention preferably have an average particle size from 20 nm to 1 μm. The inorganic particles in the photosensitive resin composition include those which are in a state of completely disaggregated primary particles and those which are in a state of aggregation of a plurality of primary particles. The particle size of inorganic particles herein means, in the case of unaggregated primary particles, a particle size of the particles and in the case of aggregation of primary particles, a particle size of the primary particles constituting the aggregate. Examples of the method for measuring the average particle size of the inorganic particles in the photosensitive resin composition include a method in which particles are observed directly with an SEM (scanning electron microscope) or TEM (transmission electron microscope) to calculate the average of the particle size. When the average particle size of the inorganic particles is not less than 20 nm, reduced specific surface area per volume of the particles improves dispersibility of the particles, and further irregularities on the surface after application and pinholes can be prevented to thereby improve the application properties in producing a photosensitive adhesive film. On the other hand, when the average particle size is not more than 1 μm, sedimentation of the inorganic particles in a photosensitive resin composition solution is prevented, and further irregularities on the surface after application and pinholes can be prevented to thereby improve the application properties in producing a photosensitive adhesive film. The average particle size is more preferably not more than 0.5 μm and still more preferably not more than 0.1 μm in terms of improving chemical resistance of a cured film.

Examples of the inorganic particles include, for example, silicates such as talc, baked clay, unbaked clay, mica, and glass; oxides such as titanium oxide, alumina, and silica; carbonates such as calcium carbonate and magnesium carbonate; hydroxides such as aluminum hydroxide, magnesium hydroxide, and calcium hydroxide; sulfates or sulfites such as barium sulfate, calcium sulfate, and calcium sulfite; borates such as zinc borate, barium metaborate, aluminum borate, calcium borate, and sodium borate; nitrides such as aluminum nitride, boron nitride, and silicon nitride, and the like. A plurality of these inorganic particles may be contained, silica and titanium oxide are preferred in terms of reliability and cost. These inorganic particles are more preferably surface treated, for example, with a silane coupling agent in order to improve dispersibility and sedimentation properties. The silane coupling agent preferably has good compatibility with a resin component of the photosensitive adhesive film; preferred is a vinyl-based, methacryl-based, acryl-based, epoxy-based, or amino-based silane coupling agent, and more preferred is a vinyl-based, methacryl-based, acryl-based, or epoxy-based silane coupling agent because the resin and inorganic particles are covalently bonded when the photosensitive adhesive film is cured by heating.

Further, silane coupling agents, titanium chelating agents, and the like can also be contained in order to enhance the adhesiveness to a base substrate such as a silicon wafer.

Furthermore, the photosensitive resin composition of the present invention can also contain crosslinking agents, crosslinking accelerators, sensitizers, dissolution regulators, stabilizers, defoamers, and the like as required.

The method of producing a photosensitive adhesive film using the photosensitive adhesive composition of the present invention will now be described according to exemplary embodiments. The photosensitive adhesive film of the present invention can be obtained by applying a solution of the photosensitive adhesive composition (varnish) on a support and then drying it as required. The photosensitive adhesive composition varnish is obtained by adding an organic solvent to the photosensitive adhesive composition. The organic solvent used here may be any solvent as long as it dissolves the photosensitive adhesive composition.

Specific examples of organic solvents include ethers such as ethylene glycol monomethyl ether, ethylene glycol monoethyl ether, propylene glycol monomethyl ether, propylene glycol monoethyl ether, ethylene glycol dimethyl ether, ethylene glycol diethyl ether, and ethylene glycol dibutyl ether; acetates such as ethylene glycol monoethyl ether acetate, propylene glycol monomethyl ether acetate, propyl acetate, butyl acetate, isobutyl acetate, 3-methoxybutyl acetate, 3-methyl-3-methoxybutyl acetate, methyl lactate, ethyl lactate, and butyl lactate; ketones such as acetone, methyl ethyl ketone, acetyl acetone, methyl propyl ketone, methyl butyl ketone, methyl isobutyl ketone, cyclopentanone, and 2-heptanone; alcohols such as butyl alcohol, isobutyl alcohol, pentanol, 4-methyl-2-pentanol, 3-methyl-2-butanol, 3-methyl-3-methoxybutanol, and diacetone alcohol; aromatic hydrocarbons such as toluene and xylene; besides N-methyl-2-pyrrolidone, N-cyclohexyl-2-pyrrolidone, N,N-dimethylformamide, N,N-dimethylacetamide, dimethyl sulfoxide, γ-butyrolactone, and the like.

Further, the photosensitive adhesive composition varnish may be filtered using a filter paper or a filter. Although the filtration method is not particularly restricted, a filtering method by pressure filtration using a filter with a pore size of 0.4 μm to 10 μm is preferred.

The photosensitive adhesive film of the present invention is preferably used formed on a support. The support not particularly limited, and various types of films that are generally commercially available such as a polyethylene terephthalate (PET) film, a polyphenylene sulfide film, and a polyimide film can be used. A surface treatment, for example, with silicone, a silane coupling agent, an aluminum chelating agent, or polyurea may be applied to the interface between the support and the photosensitive adhesive film in order to improve adhesive properties and stripping properties. The thickness of the support is not particularly restricted, and it is preferably in the range of 10 to 100 μm from the standpoint of ease of handling.

Further, the photosensitive adhesive film of the present invention may have a cover film on the film in order to protect the surface. This provides protection of the photosensitive adhesive film surface from contaminants such as dust and motes in air.

Examples of cover films include a polyolefin film, a polyester film, and the like. The cover film preferably has a small adhesive strength to the photosensitive adhesive film.

Examples of the method for applying the photosensitive adhesive composition varnish to a support include spin coating using a spinner, spray coating, roll coating, screen printing, and methods using a blade coater, die coater, calender coater, meniscus coater, bar coater, roll coater, comma roll coater, gravure coater, screen coater, slit die coater, or the like. The coating thickness varies depending on the coating technique, the solid content concentration and viscosity of the composition, and the like, and, in general, the film thickness after drying is preferably from 0.5 μm to 100 μm.

For drying, an oven, a hot plate, infrared rays, or the like can be used. The ranges of the drying temperature and drying time are not particularly limited as long as an organic solvent can be volatilized, and it is preferable to set the range as appropriate such that the photosensitive adhesive film is in an uncured or semi-cured state. Specifically, it is preferable to perform drying in the range of 40° C. to 120° C. for 1 minute to several tens of minutes. Alternatively, the temperature may be increased stepwise by combining these temperatures; for example, a heat treatment may be performed at 70° C., 80° C., and 90° C. for 1 minute each.

Next, a method of patterning the photosensitive adhesive composition of the present invention or a photosensitive adhesive film using the same and a method of thermocompression to other components will be described by way of example.

First, a method of forming a photosensitive adhesive composition coated layer on a substrate using the photosensitive adhesive composition varnish of the present invention or a photosensitive adhesive film using the same will be described. When using photosensitive adhesive composition varnish, the varnish is applied on a substrate first. Examples of the coating method include methods such as spin coating using a spinner, spray coating, roll coating, and screen printing. The coating thickness varies depending on the coating technique, the solid content concentration and viscosity of the resin composition, and the like, and, in general, it is preferable to apply coating such that the film thickness after drying is from 0.5 μm to 100 μm. The substrate coated with the photosensitive adhesive composition varnish is then dried to obtain a photosensitive adhesive composition coated layer. For drying, an oven, a hot plate, infrared rays, or the like can be used. The ranges of the drying temperature and drying time are not particularly limited as long as an organic solvent can be volatilized, and it is preferable to set the range as appropriate such that the photosensitive adhesive composition coated layer is in an uncured or semi-cured state. Specifically, it is preferable to perform drying in the range of 50 to 150° C. for 1 minute to several hours.

On the other hand, when using a photosensitive adhesive film, a cover film, if contained, is stripped off, and the photosensitive adhesive film and a substrate are opposed to each other and laminated by thermocompression to obtain a photosensitive adhesive composition coated layer. The thermocompression can be performed by thermal pressing, thermal lamination, thermal vacuum lamination, or the like. The lamination temperature is preferably 40° C. or higher in terms of adhesive properties and impregnation properties to a substrate. To prevent the decrease in resolution of pattern formation in an exposure/development process due to curing of the photosensitive adhesive film during lamination, the lamination temperature is preferably 150° C. or lower.

In both cases, examples of the substrate used include, but are not limited to, a silicon wafer, ceramics, gallium arsenide, an organic circuit board, an inorganic circuit board, those obtained by arranging constituent materials of a circuit on such a substrate, and the like. Examples of organic circuit boards include glass-based copper-clad laminates such as a glass fabric/epoxy copper-clad laminate; composite copper-clad laminates such as a glass nonwoven fabric/epoxy copper-clad laminate; heat-resistant/thermoplastic substrates such as a polyetherimide resin substrate, a polyether ketone resin substrate, and a polysulfone resin substrate; and flexible substrates such as a polyester copper-clad film substrate and a polyimide copper-clad film substrate. Examples of inorganic circuit boards include ceramic substrates such as an alumina substrate, an aluminum nitride substrate, and a silicon carbide substrate and metal-based substrates such as an aluminum-based substrate and an iron-based substrate. Examples of the constituent materials of a circuit include a conductor containing a metal such as silver, gold, or copper; a resistor containing inorganic oxide or the like; a low-dielectric material containing, for example, a glass material and/or a resin; a high-dielectric material containing a resin, high-dielectric inorganic particles, or the like; an insulator containing a glass material or the like, and the like.

Then, the photosensitive adhesive composition coated layer formed by the method described above is irradiated with actinic rays through a mask having a desired pattern for exposure. Examples of actinic rays used for the exposure include ultraviolet rays, visible rays, electron rays, X-rays, and the like, and, in the present invention, it is preferable to use i-rays (365 nm), h-rays (405 nm), or g-rays (436 nm) of a mercury lamp. In the photosensitive adhesive film, when the support is made of a material transparent to these rays, exposure can be performed without stripping the support from the photosensitive adhesive film.

To form a pattern, after the exposure, unexposed portions are removed by using a developing solution. Preferred examples of developing solutions include an aqueous solution of tetramethylammonium and an aqueous solution of an alkaline compound such as diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylamino ethanol, dimethylaminoethyl methacrylate, cyclohexylamine, ethylenediamine, hexamethylenediamine, or the like. Optionally, such an aqueous alkaline solution may be contained in combination with one or more of polar solvents such as N-methyl-2-pyrrolidone, N,N-dimethylformamide, N,N-dimethylacetamide, dimethyl sulfoxide, γ-butyrolactone, and dimethylacrylamide; alcohols such as methanol, ethanol, and isopropanol; esters such as ethyl lactate and propylene glycol monomethyl ether acetate; ketones such as cyclopentanone, cyclohexanone, isobutyl ketone, and methyl isobutyl ketone; and the like.

The development can be carried out by the method such as spraying the developing solution described above on a coated layer surface, immersing the substrate in the developing solution, or applying ultrasonic waves to the substrate while immersing in the developing solution, spraying the developing solution while rotating the substrate, or the like. Conditions of the development such as developing time and temperature of a developing-step developing solution are not particularly restricted as long as unexposed portions are removed, and it is preferable to further perform development after the unexposed portions have been removed in order to form a fine pattern or remove the residue between patterns.

After the development, rinse treatment can be carried out with water. Here again, alcohols such as ethanol and isopropyl alcohol, esters such as ethyl lactate and propylene glycol monomethyl ether acetate, and the like can be added to water to carry out the rinse treatment.

If the resolution of a pattern in the development is improved or an acceptable range of the developing conditions is extended, the step of baking can be incorporated before developing. The baking temperature is preferably in the range of 50 to 180° C. and particularly preferably in the range of 60 to 120° C. The baking time is preferably from 5 seconds to several hours.

After pattern formation, from the standpoint of reducing the solvent, volatile matter, and water that remain in the photosensitive adhesive composition coated layer, it is preferable to perform drying by heating in the range of 60 to 200° C. The time is preferably from 1 minute to several hours.

The substrate thus obtained on which the patterned photosensitive adhesive composition coated layer is formed is thermocompressed to a substrate or other components. The thermocompression temperature is preferably in the temperature range of 60 to 400° C. The pressure during the compression is preferably in the range of 0.01 to 10 MPa. The time is preferably from 1 second to several minutes.

After the thermocompression, a temperature from 120° C. to 400° C. is applied to form a cured film. This heat treatment is carried out for 5 minutes to 5 hours in such a manner that the temperature is increased stepwise from a selected temperature to a selected temperature or the temperature is increased continuously in a certain selected temperature range. For example, the heat treatment is carried out at 130° C. and 200° C. for 30 minutes each. Another example is the method of increasing the temperature linearly from room temperature to 250° C. over 2 hours. In this case, the heating temperature is preferably a temperature from 150° C. to 300° C. and more preferably from 180° C. to 250° C.

The adhered product thus obtained by thermocompression preferably has an adhesive strength of 40 MPa or more and more preferably 50 MPa or more from the standpoint of adhesive reliability.

The film thickness of the cured film can be set arbitrarily and is preferably from 0.5 μm to 100 μm.

As an application of the photosensitive adhesive composition and photosensitive adhesive film of the present invention, a semiconductor device comprising the photosensitive adhesive composition coated layer will now be described. It should be noted that semiconductor devices of various structures have been proposed in recent years, and applications of the photosensitive adhesive composition of the present invention are not limited to the following.

The photosensitive adhesive composition and photosensitive adhesive film of the present invention can be suitably used as a semiconductor adhesive for adhering, fixing, or sealing a chip, a semiconductor device, a circuit board, and a metal wire material. The semiconductor device as used herein refers not only to those in which a chip is connected to a substrate and those in which chips or substrates are connected to each other but also to devices in general that can operate by utilizing the properties of a chip, and electro-optical devices, semiconductor circuit boards, and electronic parts comprising them are all included in the semiconductor device.

An example of the method of manufacturing a semiconductor device using the photosensitive adhesive composition and photosensitive adhesive film of the present invention is as described below. A first circuit component having a first jointing terminal and a second circuit component having a second jointing terminal are arranged with the first jointing terminal and the second jointing terminal opposed to each other. Next, the photosensitive adhesive film is interposed between the above-described first jointing terminal and second jointing terminal arranged opposite to each other to form a photosensitive adhesive composition coated layer. Alternatively, a photosensitive adhesive composition coated layer is formed by applying varnish of the photosensitive adhesive composition to one or both of a first jointing terminal surface and a second jointing terminal surface and drying. The photosensitive adhesive composition coated layer is then patterned to open the first jointing terminal and the second jointing terminal at the point to be conducted. Thereafter, the first circuit component and the second circuit component are hot-pressed to electrically connect them.

The electrical connection can be carried out after forming the photosensitive adhesive composition coated layer described above in advance on the jointing terminal side surface of only one of the circuit components or after forming the photosensitive adhesive composition coated layer described above on the jointing terminal side surface of both of the first and the second circuit component. Further, a through electrode can be formed through the first circuit component and/or the second circuit component and the jointing terminal can be formed on one and/or both surfaces of the components. Examples of such circuit components used include chip parts such as a semiconductor chip on which bumps such as plate bumps or stud bumps are formed, a resistor chip, and a capacitor chip; a semiconductor chip having a TSV (through silicon via) electrode; and substrates such as a silicon interposer, a glass epoxy circuit board, and a film circuit board. By repeating the connection as described above using a circuit component having jointing terminals on both surfaces, i.e., a double-sided circuit board, a semiconductor device in which circuit components are three-dimensionally stacked can be obtained.

In the method of manufacturing a semiconductor device described above, the use of the photosensitive adhesive composition and photosensitive adhesive film of the present invention provides a semiconductor device in which edges of an adhesive after curing is located medially in edges of circuit components, i.e., a semiconductor device having a reduced occurrence of squeeze-out (fillets) of an adhesive to the periphery of circuit components after hot-pressing a first circuit component and a second circuit component. The reduction in the occurrence of fillets allows reduction in the packaging area of the semiconductor device, which can contribute to miniaturization of the semiconductor device. When the photosensitive adhesive composition of the present invention is not used, it can be possible to reduce the occurrence of fillets similarly to the above by adjusting circuit components in advance such that an adhesive composition coated layer will not be formed at the periphery of the circuit components. However, in such a method, the position can hardly be adjusted, and, in addition, when processing into one wafer, it is very difficult to form an adhesive composition coated layer at a particular portion. In contrast, in the method using the photosensitive adhesive composition and photosensitive adhesive film of the present invention, a semiconductor device having a reduced occurrence of fillets can be readily obtained by removing the photosensitive adhesive composition coated layer at the periphery of circuit components by patterning.

An example of the method of manufacturing a semiconductor device having a reduced occurrence of fillets is described below. A photosensitive adhesive composition coated layer is formed on at least one of a first jointing terminal surface that a first circuit component has and a second jointing terminal surface that a second circuit component has similarly to the method of manufacturing a semiconductor device described above. Next, by patterning the photosensitive adhesive composition coated layer, the first jointing terminal and the second jointing terminal are opened at the point to be conducted, and, at the same time, the photosensitive adhesive composition coated layer at the periphery of the first circuit component and/or the second circuit component is removed. Thereafter, the jointing terminal surfaces of the first circuit component and of the second circuit component are opposed to each other with the photosensitive adhesive composition coated layer therebetween and hot-pressed to bond them. This results in a semiconductor device with no squeeze-out of a cured product of the photosensitive adhesive composition coated layer from the first circuit component and the second circuit component.

In another application, a photosensitive adhesive composition coated layer is formed by laminating a photosensitive adhesive film on a silicon wafer on which CCD or CMOS image sensors composed of photodiodes, color filters, and microlens arrays are formed or applying varnish of the photosensitive adhesive composition and drying. After patterning this, a glass substrate was laminated and thermocompressed on the residual pattern as a supporting substrate. This is heated to cure the photosensitive adhesive composition coated layer. Thus, an image sensor of hollow structure is obtained in which a chip and a glass substrate are adhered via a cured product of the patterned photosensitive adhesive composition coated layer as a partition wall.

EXAMPLES

The present invention will now be described specifically by way of example, but the present invention is not limited thereto.

<Imidization Rate of Synthesized Polyimide>

First, an infrared spectrum of a polymer was measured to confirm the presence of absorption peaks (near 1,780 $cm^{-1}$, near 1,377 $cm^{-1}$) of an imide structure derived from a polyimide. Next, the polymer was heat treated at 350° C. for 1 hour, and then an infrared spectrum is measured again to compare peak intensities near 1,377 $cm^{-1}$ before heat treatment and after heat treatment. The imidization rate of the polymer before heat treatment was determined taking the imidization rate of the polymer after heat treatment as 100%.

<Tg of Synthesized Polyimide>

Polyimide powder was measured using a differential scanning calorimeter (available from SII NanoTechnology Inc., EXSTAR DSC 6220) at a temperature rise rate of 20° C./min, and in a curve obtained by differentiating the DSC curve, the temperature at the maximum value was employed as the Tg of the polyimide.

<Evaluation of Thermocompressibility to Irregular Substrate at Low Temperature>

Using a positive type photosensitive polyimide coating agent Photoneece PW-1000 (trade name, available from Toray Industries, Inc.), a pattern of line/space=50/50 μm is formed on a silicon wafer to obtain an irregular silicon wafer substrate. The height of the irregularities was 5 μm. Next, a cover film of the photosensitive adhesive film produced in each Example and Comparative Example was stripped off, and the stripped surface was laminated on a silicon wafer using a laminating machine (manufactured by Takatori Corporation, VTM-200M) under the conditions of a stage temperature of 80° C., a roll temperature of 80° C., a degree of vacuum of 150 Pa, a lamination speed of 5 mm/sec, and a lamination pressure of 0.2 Mpa. Then, a support film was stripped off, and then exposure was carried out using an ultra-high pressure mercury lamp at an exposure of 1,000 $mJ/cm^2$ (in terms of i-rays). The silicon wafer provided with the photosensitive adhesive film after the exposure was cut into 50×50 mm, placed on a hot plate at 100° C. with the photosensitive adhesive film up, and held for 30 seconds. After 30 seconds, the above-described irregular silicon wafer cut into 4×4 mm was placed on the photosensitive adhesive film, and thermocompression was carried out at a pressure of 0.3 MPa for 30 seconds. Then, after allowing to cool to room temperature, the irregular substrate was held with tweezers and lifted up; substrates in which the irregular silicon wafer and the 50-mm square silicon wafer were adhered were evaluated as G, and those in which they were not adhered as F.

<Evaluation of Resolution>

A photosensitive adhesive film was formed on a silicon wafer similarly to the above. Then, after stripping off a support film, a mask having patterns of line/space=75/75, 50/50, 30/30 μm was set on an aligner, and exposure was carried out using an ultra-high pressure mercury lamp at an exposure of 400 $mJ/cm^2$ (in terms of i-rays) under the conditions of an exposure gap between the mask and the photosensitive adhesive film of 100 μm. After the exposure, unexposed portions were removed by dip development using a 2.38% aqueous solution of tetramethylammonium hydroxide, and a rinse treatment was carried out with water. The developing time was 1.5 times the time required to completely dissolve the unexposed portions. The patterns thus obtained were observed under a light microscope, and the smallest size in the case where there were no abnormalities such as clogging in the line of the pattern was employed as an evaluation of resolution. Cases where the line of L/S=75/75 μm of the pattern was not developed or cases where no patterns were left on the substrate upon development were evaluated as F.

<Evaluation of Residual Film Thickness>

The residual film thickness at the exposed portions after the exposure and development as described above was calculated using the following equation. With respect to those which were evaluated as F in evaluation of resolution, the evaluation of residual film thickness was not carried out.

Residual film thickness (%)=Film thickness after development/Film thickness of photosensitive adhesive film×100

<Evaluation of Adhesive Strength at High Temperature>

A photosensitive adhesive film was formed on a silicon wafer similarly to the above. Then, a support film was stripped off, and then exposure was carried out using an ultra-high pressure mercury lamp at an exposure of 1,000 mJ/cm$^2$ (in terms of i-rays). After the exposure, unexposed portions were removed by dip development using a 2.38% aqueous solution of tetramethylammonium hydroxide, and a rinse treatment was carried out with water. The developing time was 1.5 times the time required to completely dissolve the unexposed portions. After the development, heat drying was performed for 15 minutes using a hot-air oven at 100° C. After allowing the sample to cool to room temperature, the sample was placed on a hot plate at 100° C. with the photosensitive adhesive film up and held for 30 seconds. After 30 seconds, a silicon wafer of 2×2 mm was placed on the photosensitive adhesive film and thermocompressed at a pressure of 0.3 MPa for 30 seconds. Thereafter, using an inert oven (manufactured by Koyo Thermo Systems Co., Ltd., INL-60), heat treatment was carried out at 200° C. for 60 minutes under a N$_2$ atmosphere to obtain a sample in which silicon wafers were adhered to each other. Thereafter, the adhesive strength at 260° C. was measured using a die shear tester (Dage series 4000). With respect to those which were evaluated as F in the thermocompressibility to the irregular substrate at a low temperature, the adhesive strength was not measured.

Sample size: 2 mm×2 mm
Test speed: 200 μm/s
Test height: 300 μm

The polyimides used in each Example and Comparative Example were synthesized by the following methods.

Synthesis Example 1

Under a stream of dry nitrogen, 30.95 g (0.0845 mol) of 2,2-bis(3-amino-4-hydroxyphenyl)hexafluoropropane (hereinafter referred to as BAHF) and 1.24 g (0.005 mol) of 1,3-bis(3-aminopropyl)tetramethyldisiloxane were dissolved in 100 g of N-methylpyrrolidone (hereinafter referred to as NMP). To the resultant, 31.02 g (0.1 mol) of bis(3,4-dicarboxyphenyl)ether dianhydride (hereinafter referred to as ODPA) together with 30 g of NMP were added, and the resultant was stirred at 20° C. for 1 hour and then stirred at 50° C. for 4 hours. To the resultant, 2.5 g (0.02 mol) of 3-aminophenol was added, and the resultant was stirred at 50° C. for 2 hours and then stirred at 180° C. for 5 hours to obtain a resin solution. Then, the resin solution was poured into 3 L of water to collect a white precipitate. The precipitate was collected by filtration, washed three times with water, and dried with a vacuum dryer at 80° C. for 5 hours. The imidization rate of the resin powder obtained was 94%, and the Tg was 197° C.

Synthesis Example 2

Under a stream of dry nitrogen, 20.14 g (0.055 mol) of BAHF, 1.24 g (0.005 mol) of 1,3-bis(3-aminopropyl)tetramethyldisiloxane, 7.14 g (0.03 mol) of polyoxypropylene diamine (available from MITSUI FINE CHEMICAL Inc.), and 2.5 g (0.02 mol) of 3-aminophenol as an end capping agent were dissolved in 100 g of NMP. To the resultant, 31.02 g (0.1 mol) of ODPA together with 30 g of NMP were added, and the resultant was stirred at 50° C. for 4 hours. Thereafter, the resultant was stirred at 180° C. for 5 hours to obtain a resin solution. Then, the resin solution was poured into 3 L of water to collect a white precipitate. The precipitate was collected by filtration, washed three times with water, and dried with a vacuum dryer at 80° C. for 5 hours. The imidization rate of the resin powder obtained was 95%, and the Tg was 140° C.

Example 1

One hundred grams of the polyimide obtained in Synthesis Example 1 as (A) component, 60 g of jER-630 (trade name, available from Mitsubishi Chemical Corporation) as (B) component, 60 g of BP-6EM (trade name, available from Kyoeisha Chemical Co., Ltd) as (C) component, and 5 g of NCI-831 (trade name, available from ADEKA Corporation) as (D) component were dissolved in a solvent with a propylene glycol monomethyl acetate/ethyl lactate ratio of 40/60. The amount of the solvent was controlled such that additives other than the solvent were solid and the solid content concentration was 45%. Thereafter, pressure filtration was performed using a filter with a pore size of 2 μm to obtain a photosensitive adhesive composition varnish.

The varnish obtained was applied on a PET film with a thickness of 38 μm using a comma roll coater and dried at 75° C. for 6 minutes, and then a PP film with a thickness of 10 μm was laminated thereon as a cover film to obtain a photosensitive adhesive film. The film thickness of the photosensitive adhesive film was controlled to be 30 μm. The photosensitive adhesive film obtained was used to evaluate the thermocompressibility to an irregular substrate at a low temperature, resolution, residual film thickness, and adhesive strength at a high temperature as described above. The results are shown in Table 3.

Examples 2 to 7, Comparative Examples 1 to 4

A photosensitive adhesive film was produced in the same manner as in Example 1 except that the mixing ratio of (A) through (E) components was changed as described in Tables 1 to 2, and the thermocompressibility to an irregular substrate at a low temperature, resolution, residual film thickness, and adhesive strength at a high temperature were evaluated as described above. The results are shown in Table 3.

TABLE 1

| | | Photosensitive Resin Composition (Parts by weight) | | | | | | |
|---|---|---|---|---|---|---|---|---|
| | | Example 1 | Example 2 | Example 3 | Example 4 | Example 5 | Example 6 | Example 7 |
| (A) component | Polyimide of Synthetic Example 1 | 100 | 100 | 100 | 100 | 100 | 100 | 100 |
| (B) component | jER-630 | 60 | | 30 | 10 | 150 | 100 | 30 |
| | jER-604 | | 60 | | | | | |
| (C) component | BP-6EM | 60 | 60 | 60 | 60 | 60 | 60 | 60 |
| (D) component | NCI-831 | 5 | 5 | 5 | 5 | 5 | 5 | 5 |
| (E) component | 850S | | | | 30 | | | |
| | EP4003S | | | | | | | 30 |

TABLE 2

| | | Photosensitive Resin Composition (Parts by weight) | | | |
|---|---|---|---|---|---|
| | | Comparative Example 1 | Comparative Example 2 | Comparative Example 3 | Comparative Example 4 |
| (A) component | Polyimide of Synthetic Example 1 | 100 | 100 | 100 | |
| | Polyimide of Synthetic Example 2 | | | | 100 |
| (B) component | jER-630 | | | | 60 |
| | jER604 | | | | |
| (C) component | BP-6EM | 60 | 60 | 60 | 60 |
| (D) component | NCI-831 | 5 | 5 | 5 | 5 |
| (E) component | 850S | | 60 | | |
| | EP4003S | | | 60 | |

TABLE 3

| | Termocompressibility at a Low Tempreture | Resolution L/S (μm) | Residual Film Thickness (%) | Adhesive Strength at a High Temperature (Mpa) |
|---|---|---|---|---|
| Example 1 | G | 30/30 | 88 | 7 |
| Example 2 | G | 75/75 | 87 | 8 |
| Example 3 | G | 50/50 | 96 | 10 |
| Example 4 | G | 30/30 | 92 | 4 |
| Example 5 | G | 50/50 | 86 | 3 |
| Example 6 | G | 30/30 | 85 | 5 |
| Example 7 | G | 30/30 | 95 | 5 |
| Comparative Example 1 | F | 30/30 | 95 | — |
| Comparative Example 2 | G | F | — | 8 |
| Comparative Example 3 | G | 50/50 | 90 | 1 |
| Comparative Example 4 | G | 30/30 | 88 | 1 |

In Comparative Example 1, the thermocompressibility at a low temperature was not provided because an epoxy compound, (B) component, was not used. As in Comparative Examples 2 to 3, in the cases where only an epoxy compound different from (B) component was used, a composition that satisfies desired properties was not obtained; for example, improved adhesive strength but not alkali-developable (Comparative Example 2), conversely, alkali-developable but unimproved adhesive strength (Comparative Example 3). In Comparative Example 4, the adhesive strength was not improved because a polyimide having a Tg of less than 160° C. was used.

The structures of (B), (C), and (E) used in Table 1 and Table 2 were shown below.

[Chemical Formula 10]

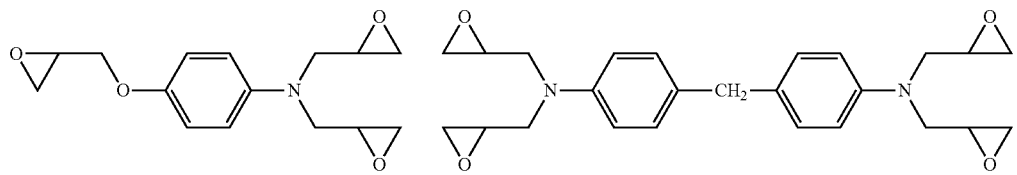

(B) jER-630, produced by Mitsubishi Chemical Corp.    (B) jER-604, produced by Mitsubishi Chemical Corp.

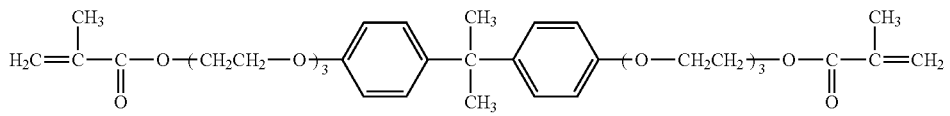

(C) BP-6EM, produced by Kyoeisha Chemical Co., Ltd.

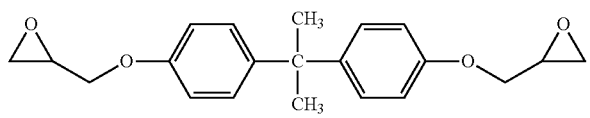

(E) 850-S, produced by DIC Corp.

-continued

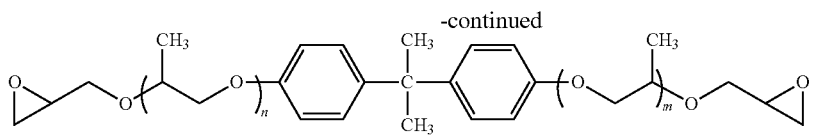

(E) EP-4003S n + m = 5 - 6, produced by ADEKA Corp.

Example 8

The photosensitive adhesive composition varnish obtained using the composition of Example 3 was applied by spin coating with a spinner and dried on a hot plate at 100° C. for 3 minutes. The rotation speed was adjusted such that the film thickness after drying was 30 µm. Thereafter, the thermocompressibility to an irregular substrate at a low temperature, resolution, and adhesive strength at a high temperature were evaluated as described above. In this case, the thermocompressibility to an irregular substrate at a low temperature was G; the resolution was L/S=50/50; and the adhesive strength at a high temperature was 10 MPa.

Example 9

A photosensitive adhesive film was obtained in the same manner as in Example 1. Next, a cover film of the photosensitive adhesive film was stripped off, and the stripped surface was laminated on a bump electrode-forming surface of a semiconductor wafer (diameter: 200 mm, thickness: 625 µm) provided with bump electrodes (gold stud bump, chip size: 7.5-mm square) using a laminating machine (manufactured by Takatori Corporation, VTM-200M) under the conditions of a stage temperature of 80° C., a roll temperature of 80° C., a degree of vacuum of 150 Pa, a lamination speed of 5 mm/sec, and a lamination pressure of 0.2 MPa to thereby obtain a semiconductor wafer provided with a photosensitive adhesive composition coated layer.

Then, a mask that forms unexposed portions at a 300-µm periphery of a semiconductor chip and gold stud bump portions in the semiconductor wafer was set in an aligner, and exposure was carried out using an ultra-high pressure mercury lamp at an exposure of 1,000 mJ/cm$^2$ (i-rays). After the exposure, the unexposed portions were removed by dip development using a 2.38% aqueous solution of tetramethylammonium hydroxide, and a rinse treatment was carried out with water. After the development, heat drying was performed for 15 minutes using a hot-air oven at 100° C. to obtain a semiconductor wafer in which photosensitive adhesive composition coated layers at the periphery of the semiconductor chip and on the bumps were removed.

Next, the semiconductor wafer obtained above was fixed to a tape frame and a dicing tape. The fixation was carried out by laminating a dicing tape (available from Lintec Corporation, D-650) on the wafer substrate surface on the side opposite to bump electrodes using a wafer mounter (manufactured by Technovision, Inc., FM-114).

Then, dicing was performed under the cutting conditions described below.

Dicing device: DAD-3350 (manufactured by DISCO Corporation)
Semiconductor chip size: 7.5×7.5 mm
Blade: NBC-ZH 2030-27HCDE
Spindle rotation speed: 30,000 rpm
Dicing speed: 25 mm/s
Cutting depth: To a depth of 10 µm of a dicing tape
Cutting method: One path full cut
Cutting mode: Down cut
Amount of water spraying to blade: 3.7 L/min
Water spraying to blade and cooling water: temperature; 23° C., electrical conductivity; 0.5 MΩ·cm (carbon dioxide is injected into ultrapure water)

As a result, a semiconductor chip (7.3-mm square) in which the photosensitive adhesive composition coated at the periphery of the semiconductor chip was removed was obtained (FIG. 1 (a)).

Next, using a flip chip bonder (manufactured by Toray Engineering Co., Ltd., FC-2000), a semiconductor chip provided with a photosensitive adhesive composition coated layer was flip-chip bonded to an adherend semiconductor chip (gold pad electrode, 7.5-mm square semiconductor chip). In the flip chip bonding, the adherend semiconductor chip was fixed to a bonding stage heated to 100° C., and a temporary compression was carried out under the conditions of a temperature of 100° C., a pressure of 15 N/chip, and a time of 5 seconds, after which a final compression was carried out for 10 seconds under the conditions of a temperature of 200° C. and a pressure of 200 N/chip to obtain a semiconductor device in which the semiconductor chip and the semiconductor chip were adhered (FIG. 1(b)).

To check the presence of squeeze-outs of the photosensitive adhesive composition coated layer from the semiconductor chip, the top surface and a cross section of the semiconductor device obtained was observed under a light microscope. In the observation from above, squeeze-outs of the adhesive to the semiconductor chip periphery were not observed. Further, as a result of the cross-sectional observation, the edge faces of the adhesive stayed inside those of the semiconductor chips as shown in FIG. 1 (b).

The photosensitive adhesive composition and photosensitive adhesive film of the present invention can be suitably used as a semiconductor adhesive for adhering, fixing, or sealing a chip, a semiconductor device, a circuit board, and a metal wire material.

DESCRIPTION OF SYMBOLS

100: Semiconductor chip provided with gold stud bump electrodes
101: Gold stud bump
102: Photosensitive adhesive composition coated layer
103: Gold pad
104: Semiconductor chip provided with gold pad electrodes

The invention claimed is:
1. A photosensitive adhesive composition comprising (A) an alkali-soluble polyimide having structural unit(s) represented by Formula (1) below and having a structure represented by Formula (2) and/or (3) at least one end of the main chain, (B) a glycidylamine type epoxy compound represented by Formula (4) or (5) below, (C) a photopolymerizable compound, and (D) a photoinitiator, wherein (A) the alkali-soluble polyimide has a glass transition temperature of 160° C. or higher;

(1)

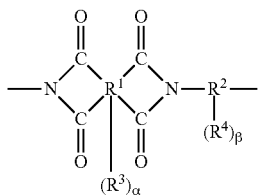

(2)

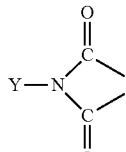

(3)

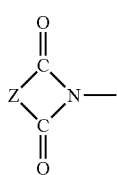

wherein in Formula (1) to (3) above, Y represents a monovalent organic group having at least one group selected from the group consisting of carboxyl group, phenolic hydroxyl group, sulfonic group, and thiol group, and Z represents a divalent organic group having at least one group selected from the group consisting of carboxyl group, phenolic hydroxyl group, sulfonic group, and thiol group; $R^1$ represents a tetra- to tetradeca-valent organic group; $R^2$ represents a di- to dodeca-valent organic group; $R^3$ and $R^4$ independently represent at least one group selected from the group consisting of carboxyl group, phenolic hydroxyl group, sulfonic group, and thiol group; and α and β independently represent an integer from 0 to 10;

(4)

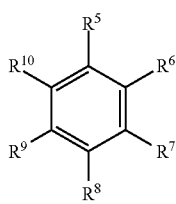

(5)

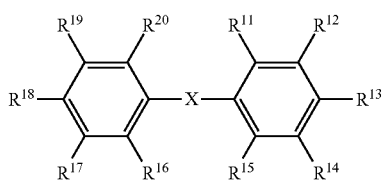

wherein in Formula (4) to (5) above, $R^5$ to $R^{20}$ may be the same or different from each other and are glycidyl ether group, group represented by Formula (6) below, hydrogen atom, or $C_1$-$C_5$ alkyl group, provided that, in Formula (4), at least one of $R^5$ to $R^{10}$ is glycidyl ether group and at least one is group represented by Formula (6) below, or at least two of $R^5$ to $R^{10}$ are group represented by Formula (6) below; wherein in Formula (5) above, at least one of $R^{11}$ to $R^{15}$ and at least one of $R^{16}$ to $R^{20}$ are group represented by Formula (6) below;

wherein in Formula (5) above, X represents direct linkage, $C_1$-$C_6$ alkylene group, ether group, thio ether group, sulfonyl group, or arylene group, wherein the alkylene group may be linear or cyclic;

(6)

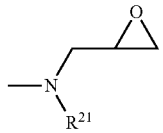

wherein in Formula (6) above, $R^{21}$ is glycidyl group or $C_1$-$C_5$ alkyl group.

2. The photosensitive adhesive composition according to claim 1, wherein $R^{21}$ in Formula (6) is glycidyl group.

3. The photosensitive adhesive composition according to claim 1, wherein the alkali-soluble group contained in (A) the alkali-soluble polyimide is phenolic hydroxyl group.

4. The photosensitive adhesive composition according to claim 1, further comprising (E) a liquid epoxy compound that has aromatic group(s) and does not have any glycidyl amino group.

5. A photosensitive adhesive film comprising (A) an alkali-soluble polyimide having structural unit(s) represented by Formula (1) below and having a structure represented by Formula (2) and/or (3) at least one end of the main chain, (B) a glycidylamine type epoxy compound represented by Formula (4) or (5) below, (C) a photopolymerizable compound, and (D) a photoinitiator, wherein (A) the alkali-soluble polyimide has a glass transition temperature of 160° C. or higher;

(1)

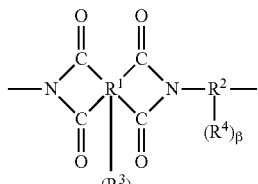

(2)

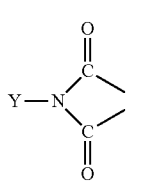

(3)

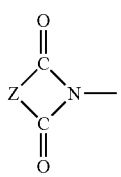

wherein in Formula (1) to (3) above, Y represents a monovalent organic group having at least one group selected from the group consisting of carboxyl group, phenolic hydroxyl group, sulfonic group, and thiol group, and Z represents a divalent organic group having at least one group selected from the group consisting of carboxyl group, phenolic hydroxyl group, sulfonic group, and thiol group; $R^1$ represents a tetra- to tetradeca-valent organic group; $R^2$ represents a di- to dodeca-valent organic group; $R^3$ and $R^4$ independently represent at least one group selected from the group consisting of carboxyl group, phenolic hydroxyl group, sulfonic group, and thiol group; and α and β independently represent an integer from 0 to 10;

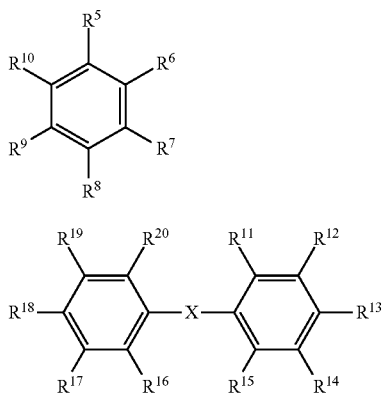

wherein in Formula (4) to (5) above, $R^5$ to $R^{20}$ may be the same or different from each other and are glycidyl ether group, group represented by Formula (6) below, hydrogen atom, or $C_1$-$C_5$ alkyl group, provided that, in Formula (4), at least one of $R^5$ to $R^{10}$ is glycidyl ether group and at least one is group represented by Formula (6) below, or at least two of $R^5$ to $R^{10}$ are group represented by Formula (6) below;

wherein in Formula (5) above, at least one of $R^{11}$ to $R^{15}$ and at least one of $R^{16}$ to $R^{20}$ are group represented by Formula (6) below;

wherein in Formula (5) above, X represents direct linkage, $C_1$-$C_6$ alkylene group, ether group, thio ether group, sulfonyl group, or arylene group, wherein the alkylene group may be linear or cyclic;

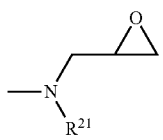

wherein in Formula (6) above, $R^{21}$ is glycidyl group or $C_1$-$C_5$ alkyl group.

6. The photosensitive adhesive film according to claim 5, wherein $R^{21}$ in Formula (6) is glycidyl group.

7. The photosensitive adhesive film according to claim 5, wherein the alkali-soluble group contained in (A) the alkali-soluble polyimide is phenolic hydroxyl group.

8. The photosensitive adhesive film according to claim 5, further comprising (E) a liquid epoxy compound that has aromatic group and does not have any glycidyl amino group.

9. A cured product of the photosensitive adhesive composition according to claim 1 or of the photosensitive adhesive film according to claim 5.

10. A semiconductor device having the cured product of the photosensitive adhesive composition according to claim 1 or of the photosensitive adhesive film according to claim 5.

11. A semiconductor device having between circuit components the cured product of the photosensitive adhesive composition according to claim 1 or of the photosensitive adhesive film according to claim 5, wherein the edges of the cured product are located medially in the edges of the circuit components.

12. A semiconductor device obtained by providing at least one of a first jointing terminal surface that a first circuit component has and a second jointing terminal surface that a second circuit component has with a photosensitive adhesive composition coated layer formed from the photosensitive adhesive composition according to claim 1 or from the photosensitive adhesive film according to claim 5, opening a desired point by patterning, and then electrically connecting said first circuit component and second circuit component by hot-pressing, wherein the edges of the cured product of said photosensitive adhesive composition or photosensitive adhesive film are located medially in the edges of said first circuit component and second circuit component.

13. A method of manufacturing a semiconductor device which involves providing at least one of a first jointing terminal surface that a first circuit component has and a second jointing terminal surface that a second circuit component has with a photosensitive adhesive composition coated layer formed from the photosensitive adhesive composition according to claim 1 or from the photosensitive adhesive film according to claim 5, opening a desired point by patterning, and then electrically connecting said first circuit component and said second circuit component by hot-pressing.

* * * * *